United States Patent
Han et al.

(10) Patent No.: US 8,368,169 B2
(45) Date of Patent: Feb. 5, 2013

(54) SEMICONDUCTOR DEVICE HAVING A DEVICE ISOLATION STRUCTURE

(75) Inventors: Seunguk Han, Suwon-si (KR); Satoru Yamada, Seoul (KR); Young Jin Choi, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 27 days.

(21) Appl. No.: 12/897,095

(22) Filed: Oct. 4, 2010

(65) Prior Publication Data
US 2011/0108962 A1    May 12, 2011

(30) Foreign Application Priority Data
Nov. 12, 2009   (KR) .................. 10-2009-0109152

(51) Int. Cl.
*H01L 21/70* (2006.01)
(52) U.S. Cl. ........... 257/506; 257/E21.54; 257/E21.546; 438/424
(58) Field of Classification Search ............. 257/E21.54, 257/E21.545, E21.546, 499, 506, 632, 635, 257/637; 438/424, 430, 434, 435
See application file for complete search history.

(56) References Cited

U.S. PATENT DOCUMENTS

| 4,571,819 A * | 2/1986 | Rogers et al. ................. 438/430 |
| 5,521,114 A * | 5/1996 | Rajeevakumar ............. 438/386 |
| 2002/0167066 A1* | 11/2002 | Ueno et al. .................... 257/505 |
| 2003/0038334 A1* | 2/2003 | Kim et al. ..................... 257/499 |

FOREIGN PATENT DOCUMENTS

| JP | 2007-048941 | 2/2007 |
| KR | 10-2006-0105852 | 10/2006 |
| KR | 10-0682181 | 2/2007 |

\* cited by examiner

*Primary Examiner* — Khiem D Nguyen
(74) *Attorney, Agent, or Firm* — Harness, Dickey & Pierce, P.L.C.

(57) ABSTRACT

An example semiconductor device includes a trench formed in a semiconductor substrate to define an active region, a filling dielectric layer provided within the trench, an oxide layer provided between the filling dielectric layer and the trench, a nitride layer provided between the oxide layer and the filling dielectric layer, and a barrier layer provided between the oxide layer and the nitride layer.

12 Claims, 17 Drawing Sheets

US 8,368,169 B2

SEMICONDUCTOR DEVICE HAVING A DEVICE ISOLATION STRUCTURE

CROSS-REFERENCE TO RELATED APPLICATIONS

This U.S. non-provisional patent application claims priority under 35 U.S.C. §119 to Korean Patent Application No. 10-2009-0109152, filed on Nov. 12, 2009, the entire contents of which are hereby incorporated by reference.

BACKGROUND

The inventive concepts relate to semiconductor devices having device isolation structures, and more specifically to semiconductor devices having device isolation structures that can suppress the degradation of transistor characteristics and methods of forming the same.

In highly integrated semiconductor devices, device isolation layers are formed on a semiconductor substrate to electrically isolate semiconductor devices. The device isolation layer may be formed by forming a trench and filling the trench with a dielectric material. In the meantime, ahead of filling the trench with the dielectric material, a liner of silicon nitride can be formed on the inner wall of the trench to relieve stress generated at the inner wall of the trench. A MOS transistor may be formed on the semiconductor substrate on which the device isolation layer is formed.

When there is a great difference between voltages at a gate electrode and a drain region during the operation of a MOS transistor, hot electrons may be generated in the channel region adjacent the drain region. The hot electrons may be trapped to a silicon nitride pattern located at the boundary between the channel region and the device isolation layer. Due to the hot electrons trapped to the silicon nitride pattern, holes may be induced at the boundary between the channel region and the device isolation layer.

Meanwhile, in the case of a PMOS transistor where majority carriers are holes, the holes induced at the boundary between the channel region and the device isolation layer may extend the drain region. As a result, the channel length of the PMOS transistor may be decreased to cause a punch-through phenomenon. Accordingly, leakage current may be generated at the transistor in an OFF-state to degrade characteristics of the transistor.

SUMMARY

Embodiments of the present inventive concepts may provide semiconductor devices having device isolation structures.

The embodiments of the present inventive concepts may not be limited to the task as mentioned above and other undisclosed tasks of the present inventive concepts could be readily apparent to those skilled in the art.

According to one embodiment of the present inventive concepts, the semiconductor device having a device isolation structure may comprise a trench formed in a semiconductor substrate to define an active region, a filling dielectric layer provided within the trench, an oxide layer provided between the filling dielectric layer and the trench, a nitride layer provided between the oxide layer and the filling dielectric layer, and a barrier layer provided between the oxide layer and the nitride layer.

BRIEF DESCRIPTION OF THE DRAWINGS

The accompanying drawings are included to provide a further understanding of the present inventive concepts, and are incorporated in and constitute a part of this specification. The drawings illustrate exemplary embodiments of the present inventive concepts and, together with the description, serve to explain principles of the present inventive concepts. In the figures.

DETAILED DESCRIPTION OF THE EMBODIMENTS

Figure 1:
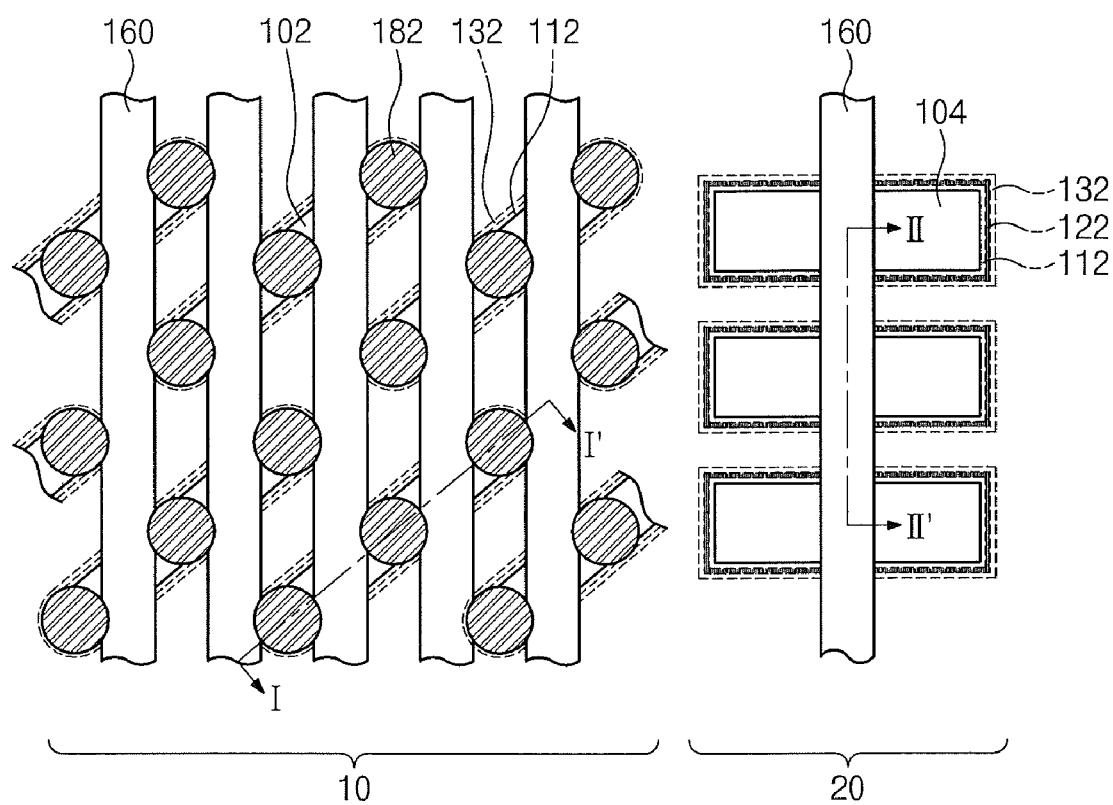
FIG. 1 is a top plan view of a semiconductor device according to one example embodiment of the present inventive concepts.

Preferred embodiments of the present inventive concepts will be described below in more detail with reference to the accompanying drawings. The embodiments of the present inventive concepts may, however, be embodied in different forms and should not be construed as limited to the embodiments set forth herein. Rather, these embodiments are provided so that this disclosure will be thorough and complete, and will fully convey the scope of the inventive concepts to those skilled in the art. The present inventive concepts is only defined by the scope as delineated in the claims. Like numerals refer to like elements throughout.

It will be understood that the termed used in this specification is to explain the present inventive concepts, and not to limit it. Unless mentioned otherwise, a singular form also includes a plural form. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention will be explained in detail with reference to the ideal illustrations, such as cross-sectional views and/or top plan views. In the drawings, the sizes and relative sizes of layers and regions are exaggerated for the effective explanation of the technical concepts. Accordingly, the illustration can be modified by manufacturing technologies and/or tolerance. Embodiments of the present inventive concepts is not limited to the specific shape illustrated herein, but includes various shapes formed by different manufacturing processes. For example, an etched area illustrated as having a right angle may have a rounded shape or a shape having a predetermined curvature. Therefore, it will be understood that the illustrated regions in the drawings outline attributes and illustrate specific exemplary shapes, and do not limit the scope of the present inventive concepts.

Figure 2:
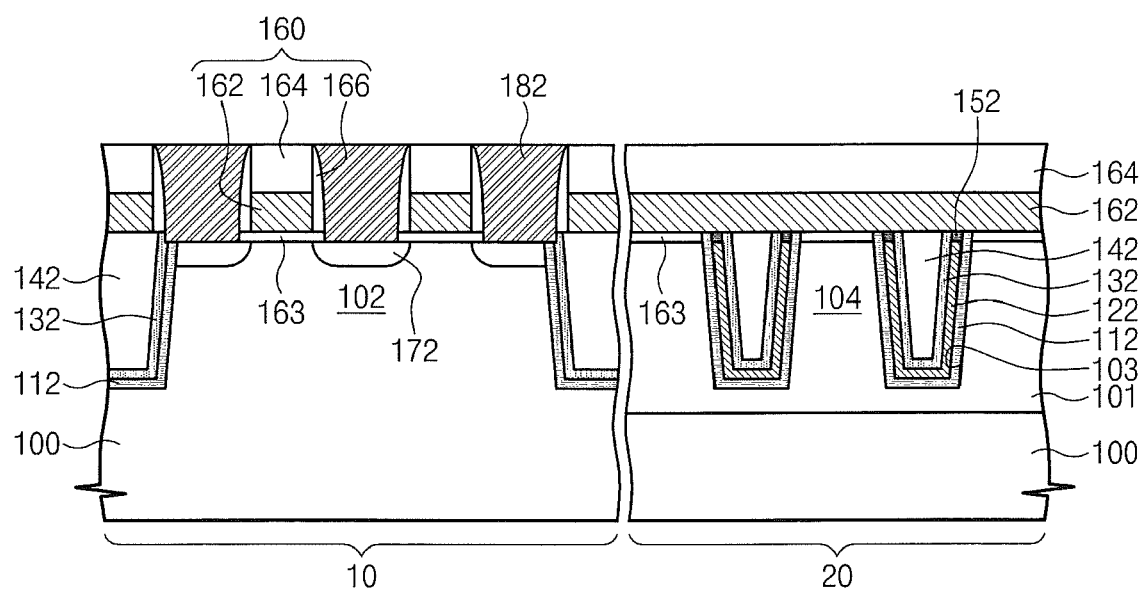
FIG. 2 is a cross-sectional view of a semiconductor device according to one example embodiment of the present inventive concepts, taken along the lines I-I' and II-II' in FIG. 1.

Referring FIGS. 1 and 2, a semiconductor device according to one example embodiment of the present inventive concepts will be fully described.

FIG. 1 is a top plan view of a semiconductor device according to one example embodiment of the present inventive concepts. FIG. 2 is a cross-sectional view of a semiconductor device according to one example embodiment of the present inventive concepts, taken along the lines I-I' and II-II' of FIG. 1.

Referring to FIGS. 1 and 2, a semiconductor substrate 100 may comprise a first region 10 on which NMOS transistors are formed and a second region 20 on which PMOS transistors are formed. For example, the first region 10 may be a memory cell region where memory cell devices are formed and the second region 20 may be a peripheral circuit region where peripheral circuits are formed.

The semiconductor substrate 100 may be a bulk silicon substrate, a silicon-on-insulator (SOI) substrate, a germanium substrate, a germanium-on-insulator (GOI) substrate, a silicon-germanium substrate, or a substrate of an epitaxial thin film formed by performing a selective epitaxial growth (SEG) process.

The semiconductor substrate 100 may comprise an impurity-doped well region 101 to form MOS transistors. For example, in the case that the semiconductor substrate 100 is a p-type semiconductor substrate 100, the second region 20 of the semiconductor substrate 100 may comprise an n-type well 101 to form PMOS transistors.

In addition, the semiconductor substrate 100 may comprise active regions 102 and 104 which are formed to define a trench 103. The trench 103 may have a sidewall profile which tapers down. The shapes of the active regions 102 and 104 defined by the trench 103 may vary with semiconductor devices.

A filling dielectric layer 142 made of a dielectric material may be disposed in the trench 103. An oxide pattern 112 and a nitride pattern 132 may be disposed between the inner wall of the trench 103 and the filling dielectric layer 142. In addition, a barrier pattern 122 may be disposed between the oxide pattern 112 disposed on the second region 20 and the nitride pattern 132. In other words, the oxide pattern 112 and the nitride pattern 132 may be sequentially formed on the inner wall of the trench 103 on the first region 10, and the oxide pattern 112, the barrier pattern 122, and the nitride pattern 132 may be sequentially formed on the inner wall of the trench 103 on the second region 20.

The oxide pattern 112 may be a thermal oxide layer and may have a thickness of approximately 10~400 Å. The oxide pattern 112 covering inner wall of the trench 103 may cure or relieve damages and defects on the inner wall of the trench 103.

The barrier pattern 122 may be locally formed on the second region 20 of the semiconductor substrate 100. The barrier pattern 122 may conformally cover the inner wall of the trench 103. The thickness of the barrier pattern 122 may be smaller than that of the nitride pattern 132 and, for example, may have a thickness of approximately 10~100 Å. The barrier pattern 122 may prevent holes from being induced to the active regions 102 and 104 adjacent the filling dielectric layer 142 by the hot electrons trapped to the nitride pattern 132. To achieve this, the barrier pattern 122 may be made of undoped polysilicon or polysilicon doped with impurities having the same conductivity as the channel of the transistor. For example, the barrier pattern 122 may be made of polysilicon doped with n-type impurities at the second region 20 where PMOS transistors are to be formed. The barrier pattern 122 may also be a metal layer containing metal materials such as Tungsten (W), Titanium (Ti), Tantalum (Ta), and Copper (Cu).

A buffer dielectric layer 152 may be disposed at the uppermost surface of the barrier pattern 122 adjacent a gate lines 160, thereby preventing contact between a contact plug 182 of the gate line 160 and the barrier pattern 122. The buffer dielectric layer 152 may be a native oxide layer or a thermal oxide layer.

The nitride pattern 132 may be formed between the barrier pattern 122 and the filling dielectric layer 142 and, for example, may have a thickness of approximately 100~300 Å. The nitride pattern 132 may prevent the thickness of the oxide pattern 112 from increasing between the active regions 102 and 104 and the filling dielectric layer 142 and reduce a stress that is generated in the inner wall of the trench 103 according to the volume expansion of the filling dielectric layer 142 filling the trench 103.

The filling dielectric layer 142 may be made of High Density Plasma (HDP) oxide, Boron-Phosphorous Silicate Glass (BPSG), Undoped Silicate Glass (USG), or Spin-On-Glass (SOG). The upper surface of the filling dielectric layer 142 may be co-planar with the upper surface of the semiconductor substrate 100, or protrude from the upper surface of the semiconductor substrate 100.

Gate lines 160 are disposed on the semiconductor substrate 100, where the filling dielectric layer 142 is formed, to cross the active regions 102 and 104. The gate line 160 may have an angle of about 0° through 90° to the active regions 102 and 104.

The gate line 160 may comprise a gate conductor pattern 162, a hard mask pattern 164 and a spacer 166. A gate dielectric pattern 163 may be disposed between the gate line 160 and the active regions 102 and 104. Impurity doped regions 172 may be disposed in the active regions 102 and 104 on both sides of the gate line 160, and the contact plug 182, which come into contact with the impurity regions 172, may be disposed between the gate lines.

when a large potential difference is generated between a gate electrode and a drain region during the operation of a transistor, hot electrons may be generated in the channel region adjacent the drain region. The hot electrons may be trapped to the silicon nitride pattern 132 located at the interface between the channel region and the filling dielectric layer 142. Because the barrier pattern 122 is interposed between the active regions 102 and 104 and the filling dielectric layer 142, the barrier pattern 122 may prevent holes from being induced in the active regions 102, 104 by the hot electrons trapped in the nitride pattern 132.

More specifically, when the barrier pattern 122 is a polysilicon layer, holes may be induced in the barrier pattern 122 by hot electrons trapped to the nitride pattern 132. When the barrier pattern 122 is a metal layer, the electric field created by the hot electrons trapped to the nitride pattern 132 may be prevented from affecting the active regions 102 and 104.

In other words, the barrier pattern 122 may prevent holes from being induced in the active regions 102, 104 by the hot electrons trapped in the nitride pattern 132 interposed between the active regions 102 and 104 and the filling dielectric layer 142. Accordingly, a semiconductor device according to one example embodiment of the present inventive concepts can prevent the leakage current of the PMOS transistor from being increased, because the holes may not be induced in the channel region adjacent to the filling dielectric layer 142

On the other hand, the first region 10, where NMOS transistors are disposed, may not experience the decrease of the channel length and the increase of the leakage current even without having the barrier pattern 122 because majority carriers of NMOS transistors are electrons.

Figure 3:
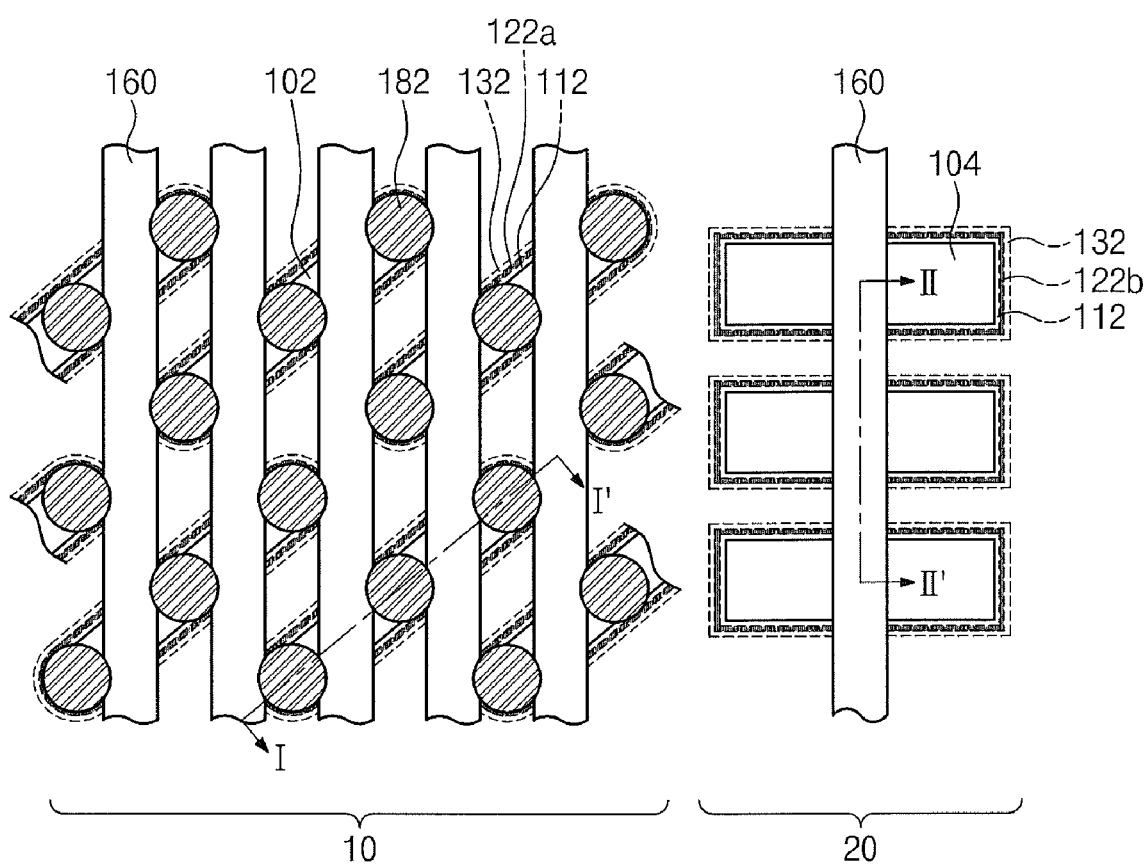
FIG. 3 is a top plan view of a semiconductor device according to another example embodiment of the present inventive concepts.
Figure 4:
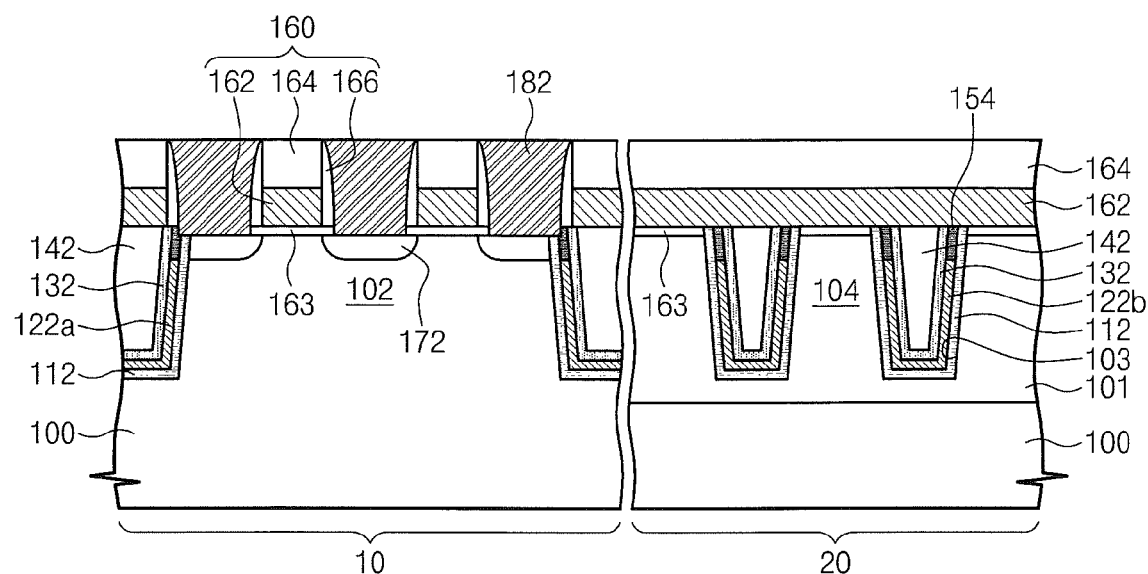
FIG. 4 is a cross-sectional view of a semiconductor device according to another example embodiment of the present inventive concepts, taken along the lines I-I' and II-II' in FIG. 3.

Referring to FIGS. 3 and 4, a semiconductor device according to another example embodiment of the present inventive concepts will be fully described. FIG. 3 is a top plan view of a semiconductor device according to another example embodiment of the present inventive concepts. FIG. 4 is a cross-sectional view of a semiconductor device according to another example embodiment of the present inventive concepts, taken along the lines I-I' and II-II' in FIG. 3.

Regarding another example embodiment, differences from the first embodiment will be disclosed. According to another example embodiment of the present inventive concepts, device isolation structures of the first region 10 and the second region 20 may be substantially the same.

Referring to FIGS. 3 and 4, on the first region 10 and the second region 20, an oxide pattern 112, a barrier pattern 122a and 122b, and a nitride pattern 132 may be sequentially disposed on the inner wall of the trench 103. The oxide pattern 112, a barrier pattern 122a and 122b, and a nitride pattern 132 may be conformally formed along the inner wall of the trench 103.

The upper surface of the barrier pattern 122a, 122b may be recessed with a predetermined depth from the upper surface of the semiconductor substrate 100. The depth of the recess, i.e. the distance between the upper surface of the barrier pattern 122a and 122b and the upper surface of the semiconductor substrate 100, may be at least smaller than the thickness of the oxide pattern 112.

According to another example embodiment of the present inventive concepts, barrier patterns 122a and 122b may be formed of an undoped polysilicon layer or a metal layer. The barrier patterns 122a, 122b may comprise a doped polysilicon and, in such case, the barrier pattern 122a of the first region 10 and the barrier pattern 122b of the second region 20 may have opposite conductivity-types. The barrier pattern 122a of the first region 10 on which NMOS transistors are formed may have the same conductivity as the channels of NMOS transistors. Conversely, the barrier pattern 122b of the second region 20 on which PMOS transistors are formed may have the same conductivity as the channels of PMOS transistors.

In addition, a buffer dielectric layer 154 may be disposed between the oxide pattern 112 and the nitride pattern 132, i.e. at the recessed portion of the barrier pattern 122a and 122b, on the upper portion of the trench 103. As a result, although the barrier pattern 122a and 122b is formed of a conductive material, the gate lines 160 and the contact plug 182 may be prevented from coming into contact with the barrier pattern 122a and 122b.

Figure 5:
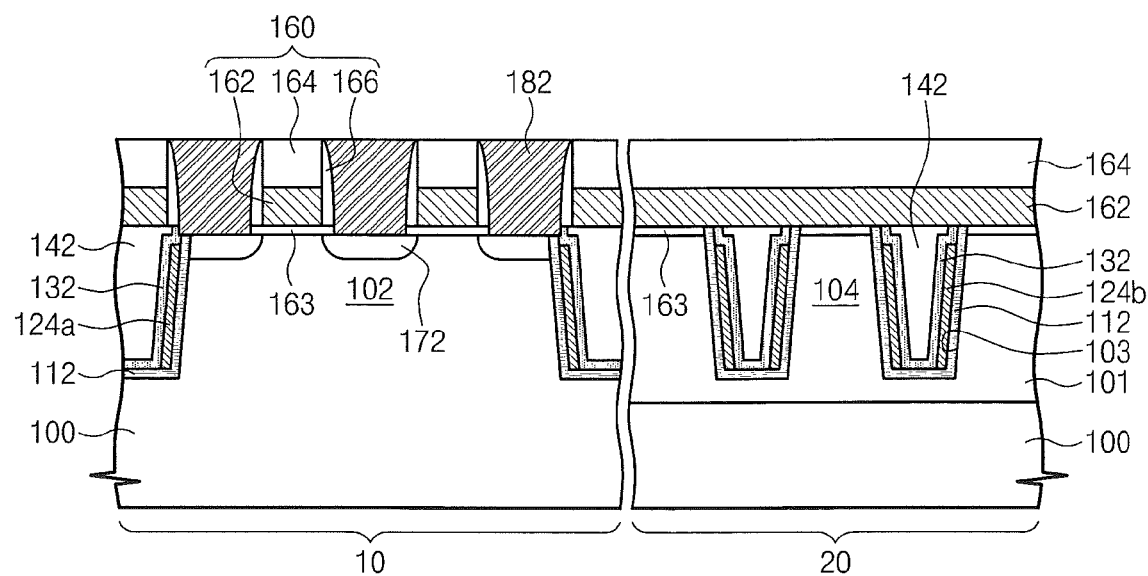
FIG. 5 is a cross-sectional view of a semiconductor device according to still another example embodiment of the present inventive concepts, taken along the lines I-I' and II-II' in FIG. 3.

Referring to FIG. 5, a semiconductor device according to still another example embodiment of the present inventive concepts will be fully described. FIG. 5 is a cross-sectional view of a semiconductor device according to still another example embodiment of the present inventive concepts, taken along the lines I-I' and II-II' of FIG. 3.

Referring to FIG. 5, barrier patterns 124a and 124b may be disposed between the sidewall of the filling dielectric layer 142 and the oxide pattern 112. The upper surface of the barrier patterns 124a and 124b may be lower than the upper surface of the semiconductor substrate 100. The distance between the upper surface of the barrier pattern 124a, 124b and the upper surface of the semiconductor substrate 100 may be larger than the thickness of the oxide pattern 112. The barrier pattern 124a, 124b may be formed of an undoped polysilicon layer or a metal layer.

The nitride pattern 132 may come into contact with the oxide pattern 112 between the bottom surface of the filling dielectric layer 142 and the bottom surface of the trench 103. In addition, the oxide pattern 112 and the nitride pattern 132 may come into direct contact with each other on the upper surface of the trench 103. Accordingly, it can be prevented that the barrier pattern 124a, 124b come into contact with the gate line 160 and the contact plug 182.

Figure 6:
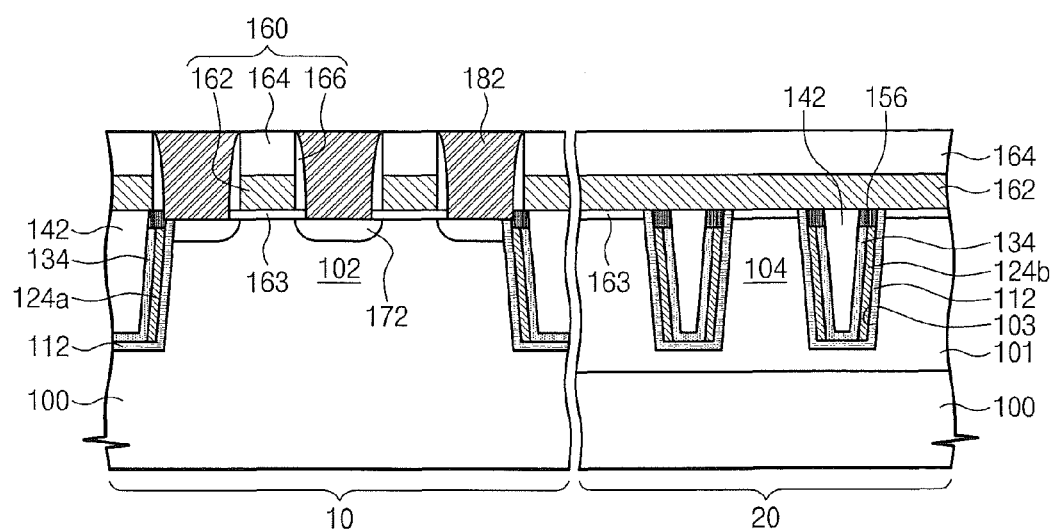
FIG. 6 is a cross-sectional view of a semiconductor device according to even another example embodiment of the present inventive concepts, taken along the lines I-I' and II-II' in FIG. 3.

Referring to FIG. 6, a semiconductor device according to even another example embodiment of the present inventive concepts will be fully described. FIG. 6 is a cross-sectional view of a semiconductor device according to even another example embodiment of the present inventive concepts, taken along the lines I-I' and II-II' of FIG. 3.

Referring to FIG. 6, the barrier pattern 124a and 124b and a nitride pattern 134 may be recessed with a predetermined depth in the trench 103. In other words, the barrier pattern 124a and 124b and the upper surface of the nitride pattern 134 may be lower than the upper surface of the semiconductor substrate 100, and a buffer dielectric layer 156 may be disposed on the barrier pattern 124a and 124b and the nitride pattern 134. In other words, the buffer dielectric layer 156 may be disposed between the oxide pattern 112 and the filling dielectric layer 142 on the upper surface of the trench 103. The buffer dielectric layer 156, like FIG. 4, may prevent the contact plug 182 and the barrier pattern 124a, 124b from coming into contact with each other. In addition, because the barrier pattern 124a, 124b are fainted on the sidewall of the trench 103, the oxide pattern 112 and the nitride pattern 134 may come into direct contact with each other on the bottom surface of the trench 103.

In the meantime, during the operation of a transistor, an electric field due to the large potential difference between a gate electrode and a drain region may be concentrated on the boundary between the drain region and the channel region. Hence, chances are high that the hot electrons may be trapped at the upper portion of the nitride pattern 134. Conversely, in even another example embodiment, with the recess of the upper portion of the nitride pattern 134, the distance between the upper surface of the semiconductor substrate 100 and the nitride pattern 134 becomes longer. Accordingly, the probability of trapping hot electrons to the nitride pattern may be reduced. Even if the hot electrons are trapped to the recessed nitride pattern 134, the barrier patterns 124a and 124b may prevent holes from being induced in the active regions 102, 104.

Hereinafter, referring to FIGS. 7A through 7G, a method for forming a semiconductor device according to one example embodiment of the present inventive concepts will be explained.

FIGS. 7A through 7G sequentially illustrate cross-sectional views of a method for forming a semiconductor device employing a device isolation structure according to one example embodiment of the present inventive concepts, taken along the lines I-I' and II-II' of FIG. 1.

Figure 7A:
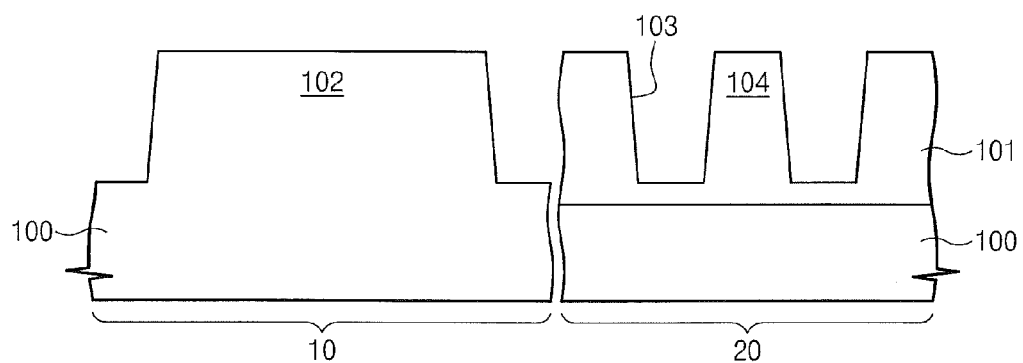
FIGS. 7A through 7G are a method for forming a semiconductor device according to one example embodiment of the present inventive concepts, taken along the lines I-I' and II-II' in FIG. 1.

Referring to FIG. 7A, a semiconductor substrate 100 comprising a first region 10 and a second region 20 may be provided. NMOS transistors may be formed on the first region of the semiconductor substrate 100, and PMOS transistors may be formed on the second region of the semiconductor substrate 100. Memory cell devices may be formed at the first region 10, and peripheral circuits controlling the memory cell devices may be formed at the second region 20.

To form NMOS and PMOS transistors on the semiconductor substrate 100, an n-type or p-type well 101 may be formed on the semiconductor substrate by regions. In other words, an n-type well 101 may be formed at the second region 20 of the semiconductor substrate 100 where PMOS transistors are to be formed.

By patterning the semiconductor substrate 100, a trench 103 may be formed to define active regions 102 and 104. Shapes of the active regions 102 and 104 may be different or identical by regions depending on the formation of the trench 103.

The trench 103 may be formed by forming a mask pattern (not shown) on the semiconductor substrate 100 and etching the semiconductor substrate 100 to a predetermined depth using the mask pattern as an etch mask. Using the dry etching process, the trench 103 may be formed such that the width of the lower portion is smaller than that of the upper portion.

Figure 7B:
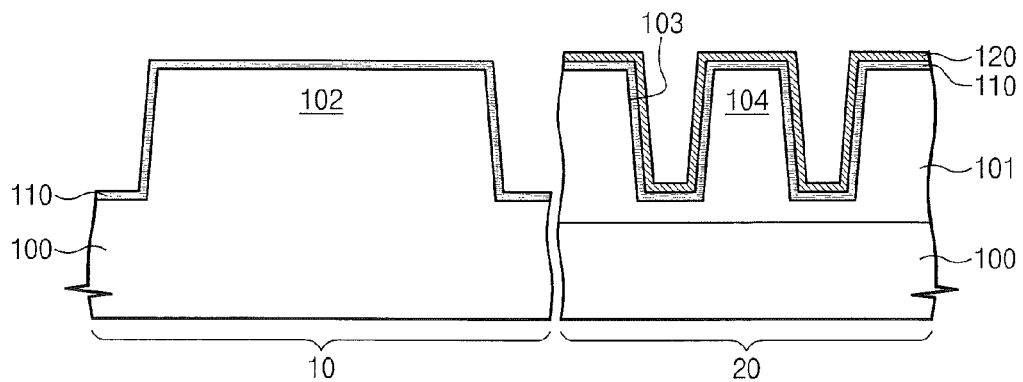

Referring FIG. 7B, an oxide layer 100 having a thickness of approximately 10~100 Å may be formed on the inner wall of the trench 103. The oxide layer 110 may relieve defects or damages on the silicon sidewall during the dry etching process for forming the trench 103.

Before forming the oxide layer 110, the mask pattern for formation of the trench 103 may be removed and, in such case, the oxide layer 110 may be formed not only on the inner wall of the trench 103 but also on the surface of the semiconductor substrate 100. In contrast, the oxide layer 110 may be formed, without removing the mask for forming the trench 103.

The oxide layer 110 may be formed by means of a thermal oxidation process. The thermal oxidation process may be carried out by a dry oxidation using $O_2$ or wet oxidation using $H_2O$ while the inner wall of the trench 103 is exposed to the exterior. The oxide layer 110 may be formed by using a layer forming technologies having an excellent step coverage property, such as a Chemical Vapor Deposition (CVD) or Atomic Layer Deposition (ALD).

Subsequently, a barrier layer 120 may be selectively formed on the second region 20. The barrier layer 120 may be conformally formed along the inner wall of the trench 103 on the oxide layer 110. The barrier layer 120 may be formed by means of deposition methods such as CVD or ALD. The barrier layer 120 may be formed of undoped polysilicon or metal. The barrier layer 120 may be formed to a thickness of approximately 10~100 Å.

Alternatively, after the forming the barrier layer 120 in the first and second regions, the oxide layer 110 in the first region 10 may be exposed by removing the barrier layer 120 in the first region 10.

Figure 7C:
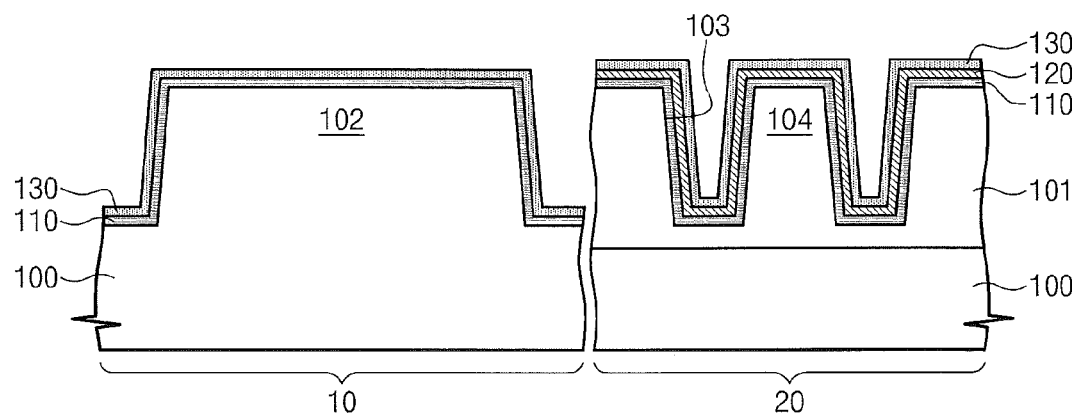

Referring to FIG. 7C, a nitride layer 130 may be formed in the first region 10 and second region 20. The nitride layer 130 may be formed on the oxide layer 110 in the first region 10 and on the barrier layer 120 in the second region 20. The nitride layer 130 may be conformally formed along the sidewall profile of the trench 103 and be formed at a thickness of approximately 100~300 Å. The nitride layer 130 may be formed to suppress the stress generated during a dielectric layer 140 deposition process to fill the trench 103, the thermal budget incurred during the thermal treatment, and the stress generated by volume expansion of the dielectric layer 140 filling the trench 103.

Figure 7D:
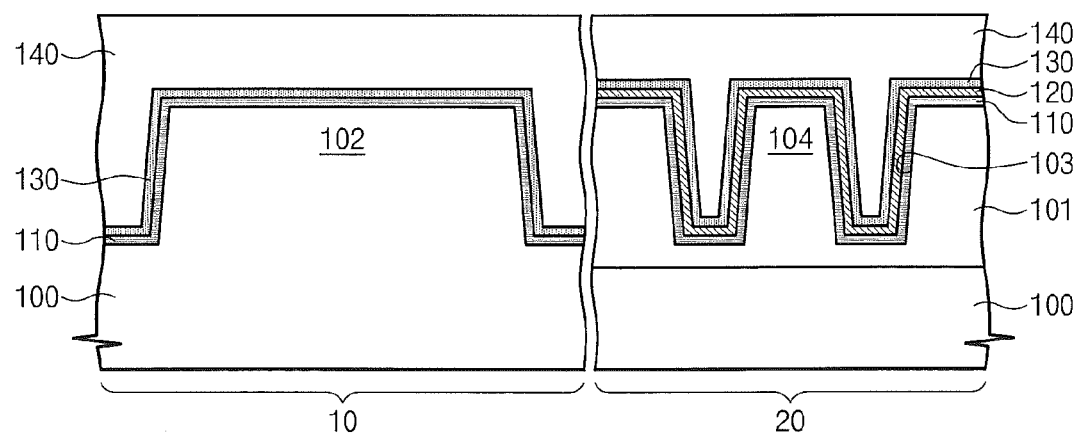

Referring to FIG. 7D, the dielectric layer 140 may be formed on the nitride layer to completely fill the trench 103.

The dielectric layer 140 may be formed thick up to the upper portion of the semiconductor substrate 100, filling up the inner portion of the trench 103. The dielectric layer 140 filling the trench 103 may be formed by means of at least one of thin film forming technologies having a superior step coverage property. For example, the dielectric layer 140 may be formed by means of deposition methods such as CVD, PVD or a spin-coating.

The dielectric layer 140 may be formed of a material having a superior gap filling property such as a Boron-Phosphorous Silicate Glass (BPSG) layer, High Density Plasma (HDP) oxide layer, Undoped Silicate Glass (USG) or Tonen SilaZene (TOSZ).

After forming the dielectric layer 140, a thermal treatment process may be performed to densify the dielectric material.

Figure 7E:
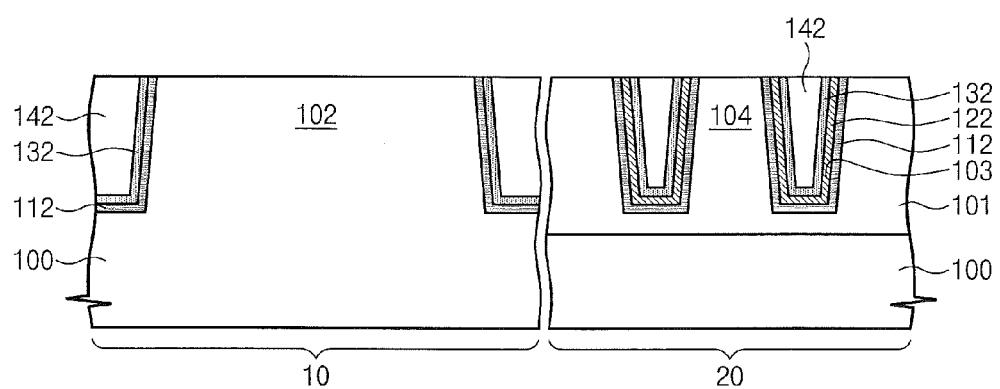

Referring to FIG. 7E, by successively planarizing the oxide layer 110, the barrier layer 120, the nitride layer 130 and the dielectric layer 140, an oxide pattern 112, a barrier pattern 122, a nitride pattern 132, and a filling dielectric layer 142 may be formed.

More specifically, the dielectric layer 140 may be planarized by means of Chemical Mechanical Polishing (CMP) process until the nitride layer is exposed.

The nitride layer 130 and the barrier layer 120 may be planarized using a wet or dry etching process until the oxide layer 110 is exposed. For example, the nitride layer on the active regions 102, 104 may be removed by a wet etching process using $H_3PO_4$ and HF solution. According to the wet etching process, the nitride pattern 132 may have a structure filled up between the filling dielectric layer 142 and the barrier pattern 122, within the trench 103.

The barrier pattern 122 at the active regions 102 and 104 may be removed by means of a wet etching process using TMAH, KOH, $NH_4OH$, or a mixed solution of $HNO_3$ and HF. Alternatively, the barrier pattern 122 at the active regions 102 and 104 may be removed by performing an etch-back process. As a result, the barrier pattern 122 may be formed around the active regions 102, 104, and have a filled-up structure within the trench 103. In addition, the oxide layer 110 may be removed at the surface of the active regions 102, 104, thereby forming an oxide pattern 112 in the trench 103.

Figure 7F:
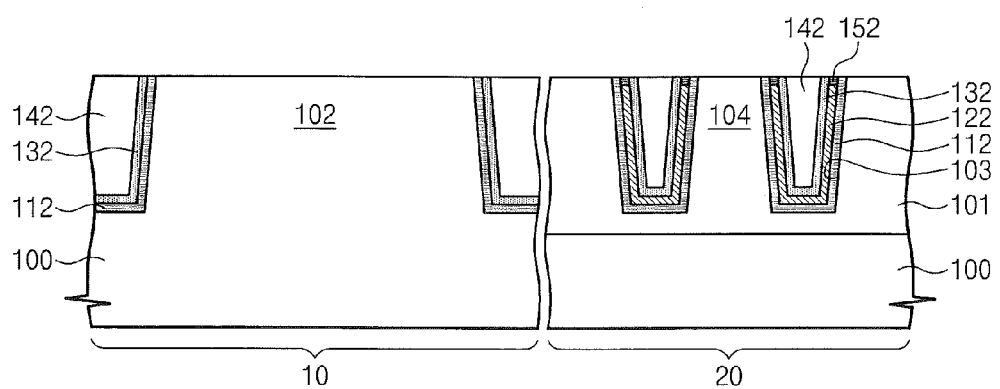

Referring to FIG. 7F, a buffer dielectric layer 152 may be formed on the surface of the exposed barrier pattern 122. The buffer dielectric layer 152 may be a native oxide, which naturally occurs during a subsequent process, or a thermal oxide layer. Accordingly, device isolation structures in the trenches 103 of the first region 10 and the second region 20 are accomplished.

After forming the device isolation structures, ion-implantation process may be performed to form the channels of transistors by regions. More specifically, p-type impurities may be implanted into the active regions 102 and 104 in the first region 10 where NMOS is to be formed, and n-type impurities may be implanted into the active regions 102 and 104 in the second region 20 where PMOS is to be formed.

Meanwhile, during ion-implantation for forming channels in the active regions 102 and 104 of the second region 20, n-type impurity may be implanted not only into the active regions 102, 104, but also into the barrier pattern 122 comprising polysilicon. Accordingly, the barrier pattern 122 may be formed of an impurity-doped polysilicon having the same conductivity as the active regions 102, 104 in the second region 20.

Figure 7G:
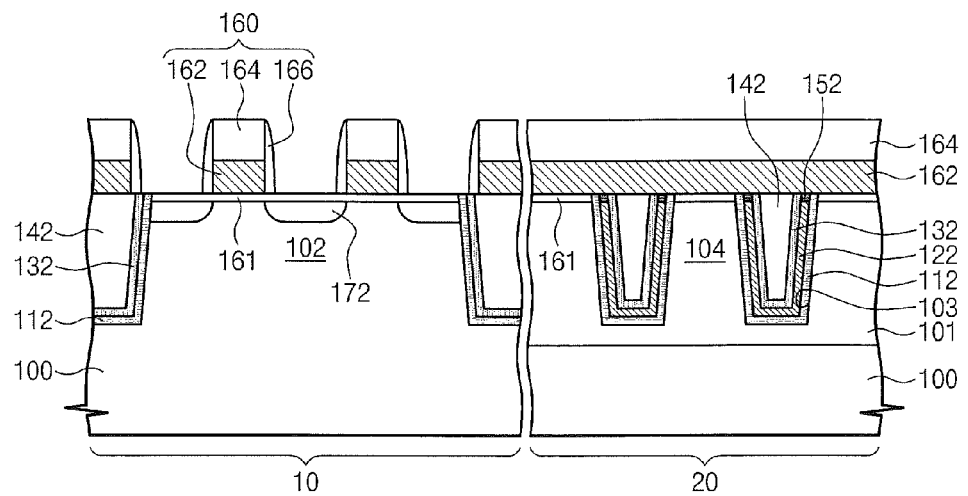

Referring to FIG. 7G, a gate line 160 may be formed crossing the active regions 102 and 104. The gate line 160 may be formed on a gate dielectric layer 161, which is on the surface of the active regions 102, 104. In addition, the gate line 160 formed in the second region 20 may be insulated from the barrier pattern 122 using the buffer dielectric layer 152.

More specifically, the process for forming the gate line 160 may comprise forming a gate conductive layer and a hard mask on the gate dielectric layer 161, forming a gate conductive pattern 162 and a hard mask pattern 164 by patterning, and forming a spacer 166 on both sidewalls of the gate conductive pattern 162 and on both sidewalls of the hard mask pattern 164.

The gate conductive pattern 162 may be formed to include at least one selected from the group consisting of polysilicon layer, metal layer, metal nitride layer and metal silicide layer. The hard mask pattern 164 and the spacer 166 may be formed of silicon nitride.

After forming the gate line 160, using the gate line 160 as an ion-implantation mask, impurity regions 172 may be formed on both sides of the gate line 160 in the active regions 10, 102, 104. Because the impurity regions 172 in the first region 10 is formed of a different conductivity from the impurity regions 172 in the second region 20, the process for forming the impurity regions 172 may be performed separately for the first and the second regions 10, 20.

Referring back to FIG. 2, a contact plug 182 may be formed to come into contact with the impurity regions 172. The process for forming the contact plug 182 may comprise forming an interlayer dielectric layer (not shown) covering the gate line 160 and forming a contact hole exposing the impurity regions 172 by anisotropically etching the interlayer dielectric layer. When forming the contact hole, the gate dielectric layer 161 on the surface of the impurity regions 172 may be etched by means of a dry etching process, thereby resulting in a gate dielectric pattern 163. Subsequently, the contact hole may be filled with a conductive material and planarized to form the contact plug 182.

Hereinafter, referring to FIGS. 8A through 8F, a method for forming a semiconductor device according to another example embodiment of the present inventive concepts will be explained. FIGS. 8A through 8F are cross sectional views illustrating a method for forming a semiconductor device according to another example embodiment of the present inventive concepts, taken along the lines I-I' and II-II' in FIG. 3.

The steps of this example embodiment, which is substantially the same as illustrated in the foregoing example embodiment will not be repeated here.

Figure 8A:
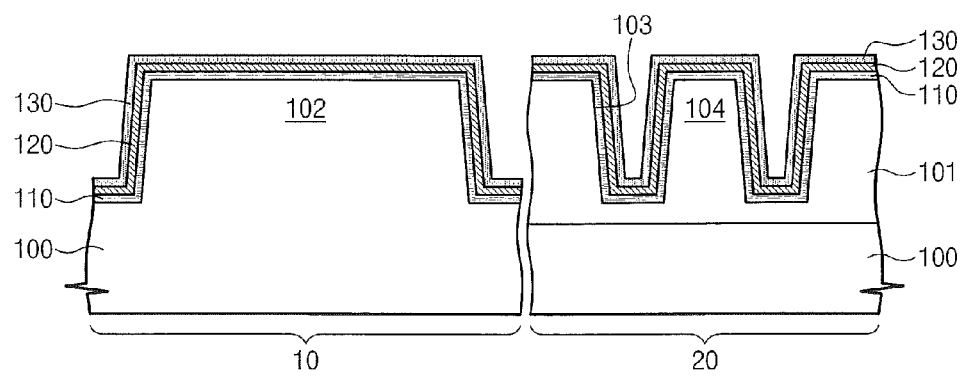
FIGS. 8A through 8F are a method for forming a semiconductor device according to another example embodiment of the present inventive concepts, taken along the lines I-I' and II-II' in FIG. 3.

Referring to FIG. 8A, as illustrated in FIG. 7A, a trench 103 may be formed by patterning a semiconductor substrate 100. Next, similar to the foregoing explanations in connection with FIGS. 7B through 7D, an oxide layer 110, a barrier layer 120 and a nitride layer 130 may be formed along the surface of the semiconductor substrate 100 having the trench 103. Unlike the foregoing embodiment, the oxide layer 110, the barrier layer 120 and the nitride layer 130 may be formed to be identical in the first and the second regions 10, 20.

Figure 8B:
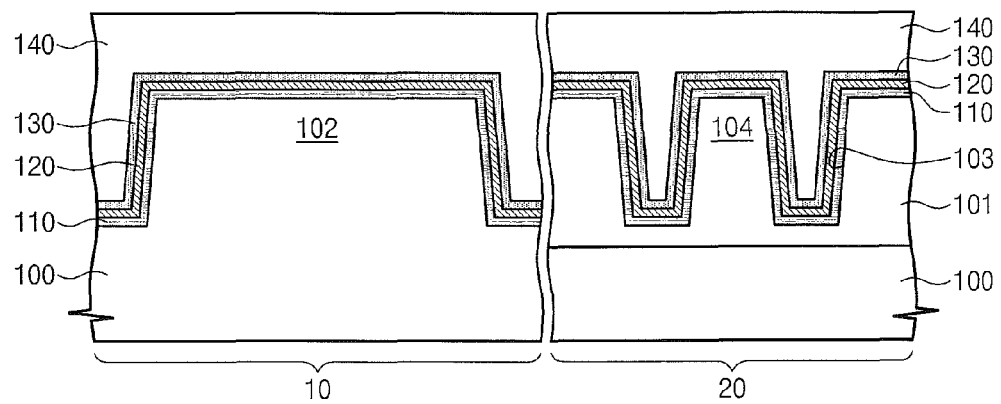

Referring to FIG. 8B, as illustrated in FIGS. 7E and 7F, a dielectric layer 140 may be formed to fill up the trench 103 on the nitride layer 130. The dielectric layer 140 may be formed of a dielectric material having a superior gap-fill characteristic.

Figure 8C:
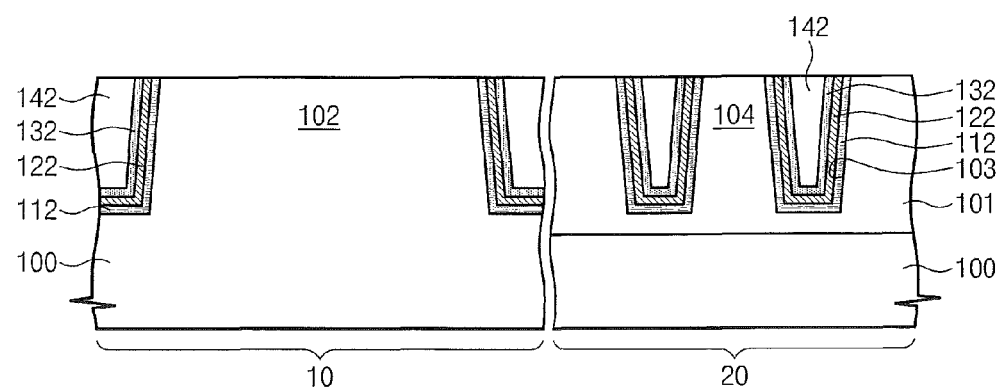

Referring to FIG. 8C, a filling dielectric layer 140 may be formed in the trench 103 by planarizing the dielectric layer 140. In addition, by sequentially planarizing the nitride layer 130, the barrier layer 120, and the oxide layer 110, a nitride pattern 122, barrier patterns 122a and 122b, and a oxide pattern 112 may be formed locally in the trench 103. As a result, the oxide pattern 112, the barrier patterns 122a and 122b, the nitride pattern 122, and the filling dielectric layer 142 may fill up within the trench 103 and the upper surfaces of the oxide pattern 112, the barrier patterns 122a and 122b, the nitride pattern 122, and the filling dielectric layer 142 may be exposed.

Figure 8D:
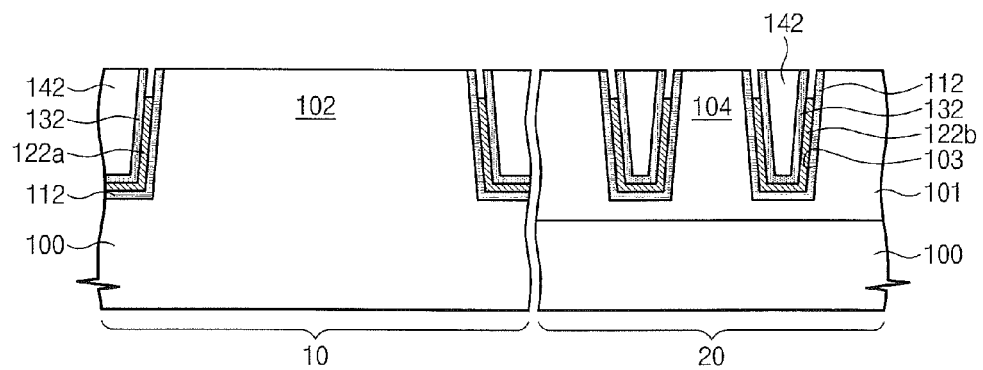

Referring to FIG. 8D, the upper portion of the barrier patterns 122a and 122b formed in the trench 103 may be recessed. Accordingly, a portion of the sidewall of the nitride pattern 132 and a portion of the sidewall of the oxide pattern 112 may be exposed at the upper portion of the trench 103.

The process for recessing the barrier pattern 122a and 122b may be done by over-etching the barrier pattern 122a and 122b when planarizing them using an etching process. The depth of the recess of the barrier pattern 122a and 122b may be controlled depending on etching process conditions and it may be desirable that the depth is greater than the thickness of the oxide pattern 112. Because the barrier pattern 122a and 122b tend to have an etching selectivity to the oxide pattern 112 and the nitride pattern 132, the upper portion of the barrier pattern 122a and 122b may be selectively recessed. The recess depths of the first region 10 and the second region 20 may be different from each other.

Figure 8E:
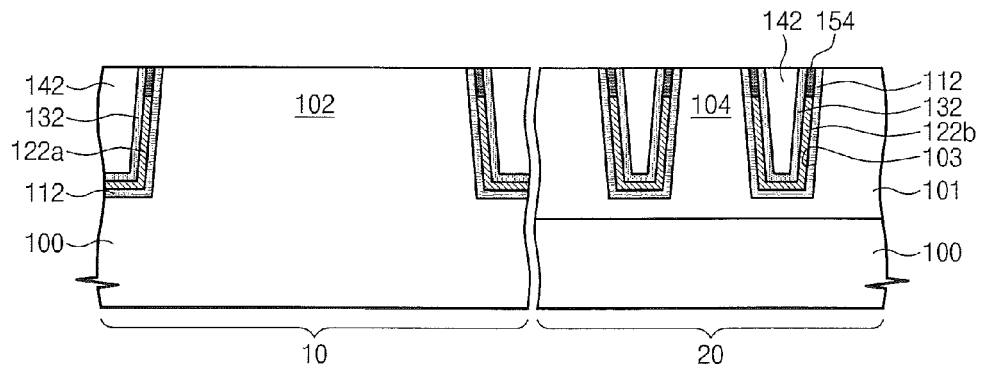

Referring to FIG. 8E, a buffer dielectric layer 154 filling up the upper portion of the recessed barrier pattern 122a and 122b may be formed. The buffer dielectric layer 154 may be formed by depositing an oxide layer using deposition methods such as CVD or ALD. Alternatively, the buffer dielectric layer 154 may be formed of native oxide, which is fowled during a subsequent process. During depositing the buffer dielectric layer 154, the buffer dielectric layer 154 may be deposited not only inside of the trench 103, but also at the active regions 102 and 104. In such a case, a planarization process for the buffer dielectric layer 154 may also be performed.

After forming the buffer dielectric layer 154, an ion-implantation process may be performed to form the channels of transistors by regions. More specifically, a p-type impurity may be ion-implanted into the active regions 102 and 104 in the first region 10 where NMOS is to be formed, and an n-type impurity may be ion-implanted into the active regions 102 and 104 in the second region 20 where PMOS is to be formed. In the case that the barrier patterns 122a and 122b are formed of polysilicon, impurities may be implanted into the barrier patterns 122a and 122b. As a result, the p-type impurity may be implanted into the barrier patterns 122a and 122b in the first region 10, and the n-type impurity may be implanted into the barrier patterns 122a and 122b in the first region 20.

Figure 8F:
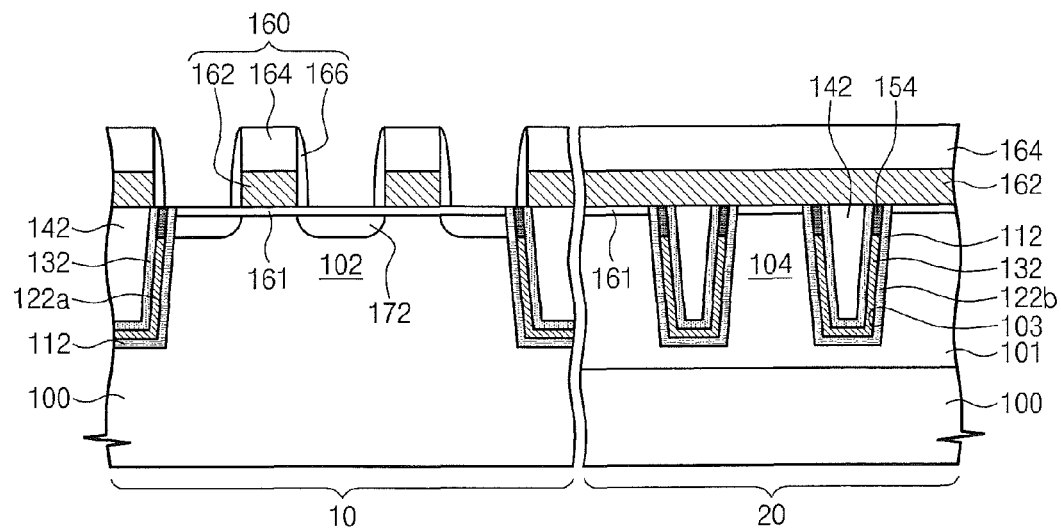

Referring to FIG. 8F, as illustrated in FIG. 7G, a gate line 160 crossing the active regions 102, 104 may be formed. The gate line 160 may be formed on a gate dielectric layer 161, which is formed on the surface of the active regions 102, 104. Impurity regions 172 may be formed at both sides of the gate lines 160.

Referring back to FIG. 4, contact plugs 182 may be formed to come into contact with the impurity regions 172. To form the contact plugs 182, an interlayer dielectric layer (not shown) may be formed, and contact holes may be formed therein. The contact holes may be formed by a conventional photo-etching process and a gate dielectric layer pattern 163 may be formed when the gate dielectric layer 161 is etched on the upper surface of the impurity regions 172. Because the upper portion of the barrier patterns 122a and 122b are recessed to a predetermined depth, the barrier patterns 122a and 122b from being exposed during forming the contact hole. Afterwards, by filling in the contact holes with a conductive material and planarizing, the contact plugs 182 may be formed.

Hereinafter, referring to FIGS. 9A through 9E, a method for forming a semiconductor device according to still another example embodiment of the present inventive concepts will be explained. FIGS. 9A through 9E are cross sectional views illustrating a method for forming a semiconductor device according to still another example embodiment of the present inventive concepts, taken along the lines I-I' and II-II' of FIG. 3.

The steps of this example embodiment, which is substantially the same as illustrated in the foregoing example embodiments will not be repeated here.

Figure 9A:
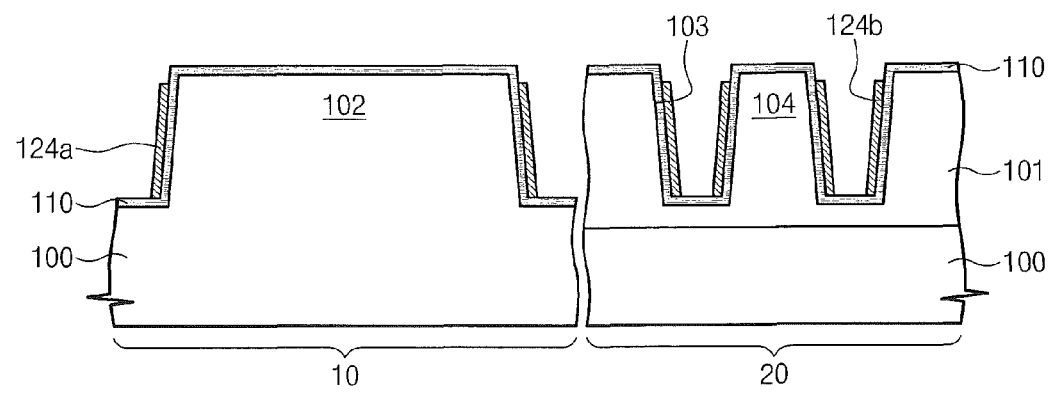
FIGS. 9A through 9E are another method for forming a semiconductor device according to still another example embodiment of the present inventive concepts, taken along the lines I-I' and II-II' in FIG. 3.

Referring to FIG. 9A, as illustrated in FIG. 7A, a trench 103 may be formed by patterning a semiconductor substrate 100. An oxide layer 110 may be formed on the inner wall of the trench 103 by means of a thermal oxidation or vapor deposition methods. The oxide layer may be formed to a thickness of approximately 10~100 Å and may be formed on the entire surface of the semiconductor substrate 100.

After forming the oxide layer 110, barrier patterns 124a and 124b may be formed locally on the sidewall of the trench 103. The barrier patterns 124a and 124b may be formed of undoped polysilicon or metal. The barrier patterns 124a and 124b may be formed to a thickness of approximately 10~100 Å.

More specifically, the process for forming the barrier patterns 124a, 124b may comprise conformally forming the barrier layers along the surface of the oxide layer 110 and etching back the barrier layers. Because the barrier layer may be removed at the bottom portion of the trench 103 and active regions 102 and 104, the barrier patterns 124a and 124b may formed locally on the sidewall of the trench 103. During the etching back, the barrier pattern 124a, 124b may be overetched at the upper portion of the sidewall of the trench 103. As a result, the upper surface of the barrier patterns 124a and 124b may be located under the upper surface of the semiconductor substrate 100. In addition, the barrier patterns 124a and 124b may have a high-heeled horn shape by the anisotropic etching process.

Figure 9B:
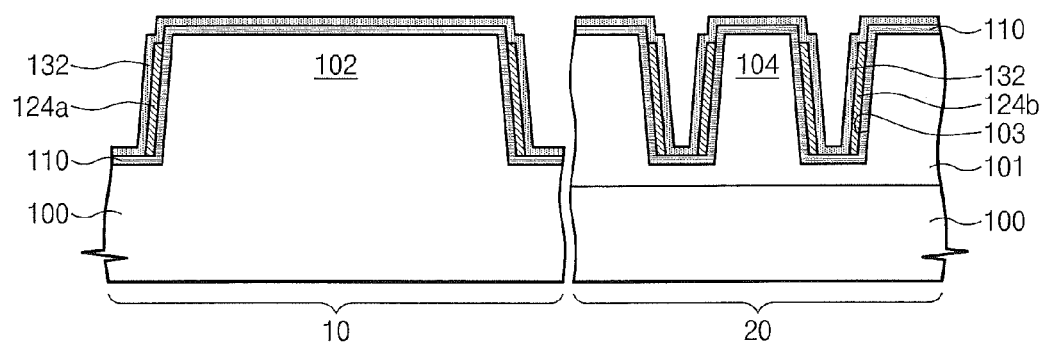

Referring to FIG. 9B, a nitride layer 130 may be formed on the trench 103, on the sidewall portion of which the barrier patterns 124a and 124b are formed. The nitride layer 130 may be formed conformally along the surface of the resultant structure. In other words, the nitride layer 130 may come into contact with the barrier patterns 124a and 124b at the sidewall portion of the trench 103 and come into contact with the oxide layer 110 at the bottom portions and the upper portion of the trench 103.

Figure 9C:
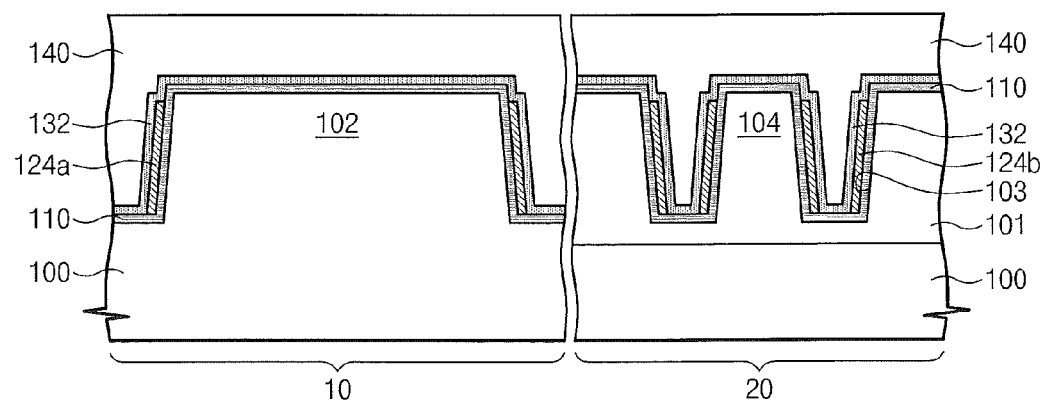

Referring to FIG. 9C, a dielectric layer 140 filling the trench 103 may be formed on the nitride layer. The dielectric layer 140, as illustrated in FIG. 7D, may be formed of a material having a superior gap filling property and may be formed thick up to the upper portion of the semiconductor substrate 100 as filling the inner portion of the trench 103.

Figure 9D:
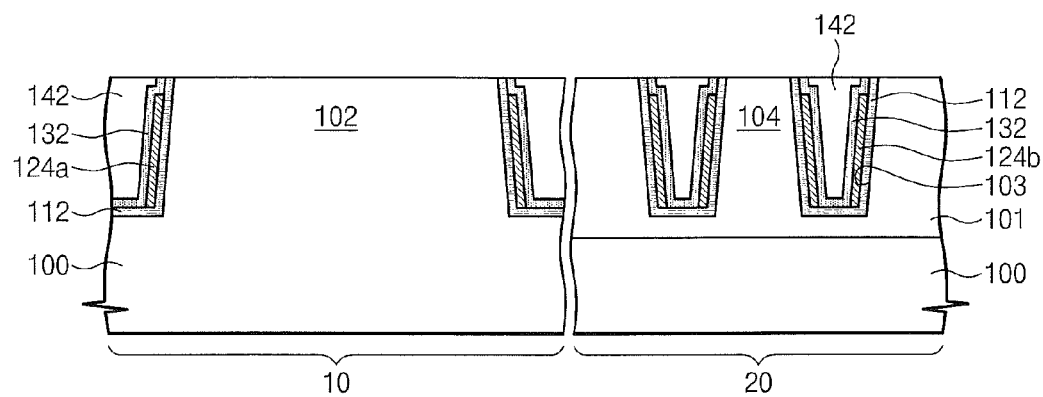

Referring to FIG. 9D, by successively planarizing the dielectric layer 140, the nitride layer 130 and the oxide layer 110, a filling dielectric layer 142 and a nitride pattern 132 may be formed in the trench 103. Because the upper surface of the barrier patterns 124a and 124b is located under the upper surface of the semiconductor substrate 100, the upper surface of the barrier patterns 124a and 124b may not be exposed by the planarization process.

After forming the device isolation structure as above, an ion-implantation process may be performed to form the channels of transistors by regions. More specifically, p-type impurities may be implanted into the active regions 102 and 104 in the first region 10 where NMOS is to be formed, and n-type impurities may be implanted into the active regions 102 and 104 in the second region 20 where PMOS is to be formed.

Because the surface of the barrier patterns 124a and 124b between the active regions 102 and 104 and the filling dielectric layer 142 is not exposed during the channel ion-implantation process, the barrier patterns 124a and 124b may remain as an undoped polysilicon.

Figure 9E:
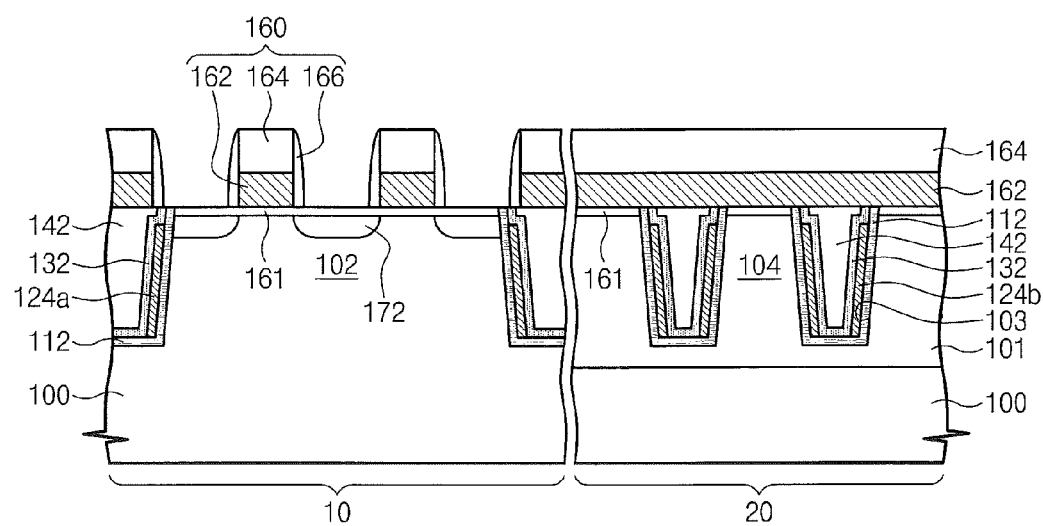

Referring to FIG. 9E, as illustrated in FIG. 7G, a gate line 160 may be formed crossing the active regions 102, 104. The gate line 160 may be formed on a gate dielectric layer 161 and on the nitride pattern 132 and the filling dielectric layer 142 around the active regions 102 and 104. Even in the case that the barrier patterns 124a and 124b are formed of a conductive material, the barrier patterns 124a and 124b may not come into contact with the gate conductive pattern 162 because the upper surface of the barrier patterns 124a and 124b is lower than that of the semiconductor substrate 100.

Thereafter, referring to FIG. 5, a contact plug 182 may be formed to come into contact with the impurity regions 172. The process for forming the contact plug 182 may comprise forming an interlayer dielectric layer (not shown) covering the gate line 160, forming a contact hole exposing the impurity regions 172 by anisotropically etching the interlayer dielectric layer, filling the contact hole with a conductive material, and planarizing the same. When forming the contact hole, because the distance between the upper surface of the barrier patterns 124a and 124b and the upper surface of the semiconductor substrate 100 is larger than the thickness of the oxide pattern 112, the barrier patterns 124a and 124b may be prevented from being exposed even though the nitride pattern 132 around the active regions 102 and 104 are etched.

Hereinafter, referring to FIGS. 10A through 10F, a method for forming a semiconductor device according to still another example embodiment of the present inventive concepts will be explained. FIGS. 10A through 10F are cross sectional views illustrating a method for forming a semiconductor device according to still another method for forming a semiconductor device according to even another example embodiment of the present inventive concepts, taken along the lines I-I' and II-II' in FIG. 3.

Figure 10A:
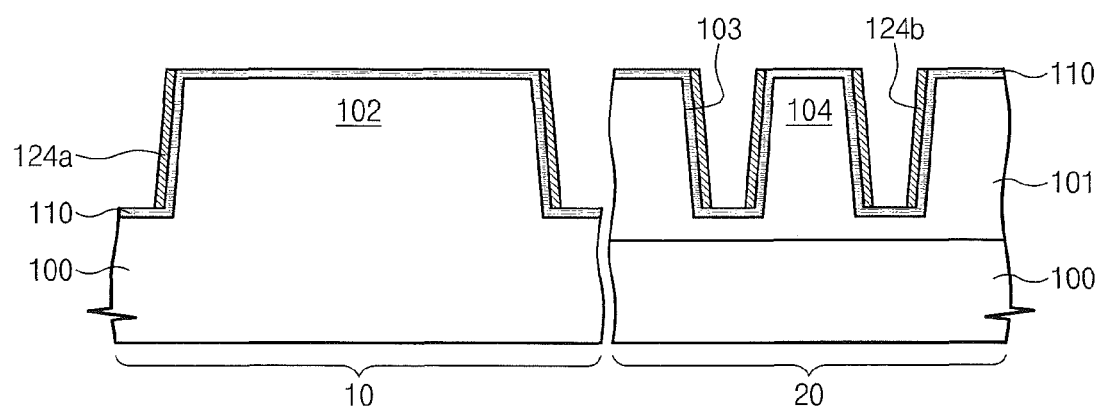
FIGS. 10A through 10F are still another method for forming a semiconductor device according to even another example embodiment of the present inventive concepts, taken along the lines I-I' and II-II' in FIG. 3.

Referring to FIG. 10A, as illustrated in FIG. 7A, a trench 103 may be formed by patterning a semiconductor substrate 100. An oxide layer 110 may be formed on the inner wall of the trench 103, using a thermal oxidation or vapor deposition methods. The oxide layer 110 may be formed approximately 10~100 Å thick and may be formed on the entire surface of the semiconductor substrate 100.

After forming the oxide layer 110, barrier patterns 124a and 124b may be formed locally on the sidewall of the trench 103. More specifically, after conformally forming the barrier layer along the surface of the oxide layer 110, the barrier layer may be etched back. Accordingly, the barrier layer may be removed on the bottom portion of the trench 103 and the active regions 102, 104, thereby locally forming the barrier patterns 124a and 124b on the sidewall of the trench 103. In addition, during etching back the barrier layer, the barrier pattern 124a and 124b may cover a portion of the sidewall of the trench 103 due to the over-etching of the barrier layer.

Figure 10B:
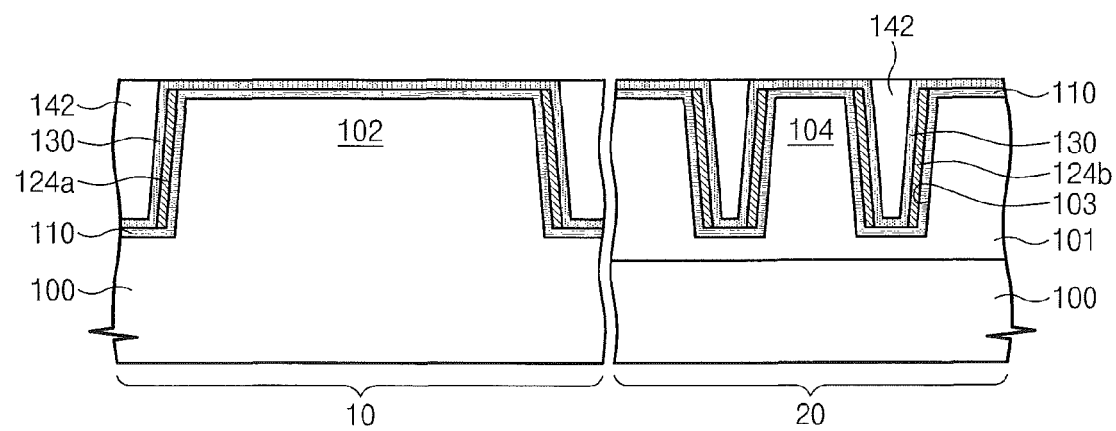

Referring to FIG. 10B, a nitride layer 130 may be formed on the trench 103, on the sidewall portion of which the barrier patterns 124a and 124b are formed. The nitride layer 130 may be formed conformally along the surface of the resultant structure. Thereafter, as illustrated with reference to the FIGS. 9C and 9D, a dielectric layer filling the trench 103 may be deposited thick and planarized to form a filling dielectric layer 142 in the trench.

Figure 10C:
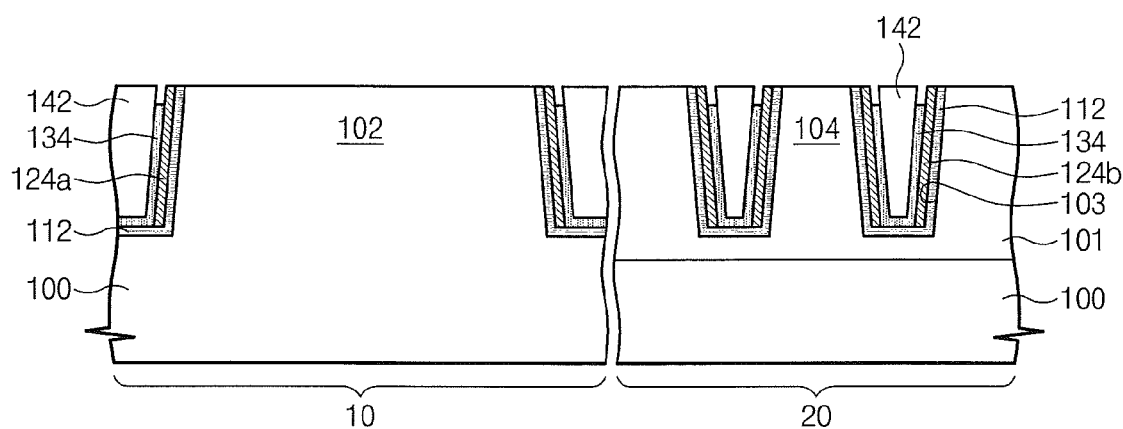

Referring to FIG. 10C, a nitride pattern 134 may be formed by planarizing the nitride layer 130. The planarization may be carried out through wet etching process using $H_3PO_4$ and HF solution. In the case that the nitride layer 130 is planarized by means of the wet etching process, a portion of the nitride layer 130 in the trench may be removed. Accordingly, the nitride pattern 134 may be formed between the sidewall of the filling dielectric layer 142 and the barrier patterns 124a and 124b and may have a recessed structure at the upper portion. In other words, a portion of the sidewalls of the barrier patterns 124a and 124b and the filling dielectric layer 142 may be exposed on the upper portion of the trench 103.

Figure 10D:
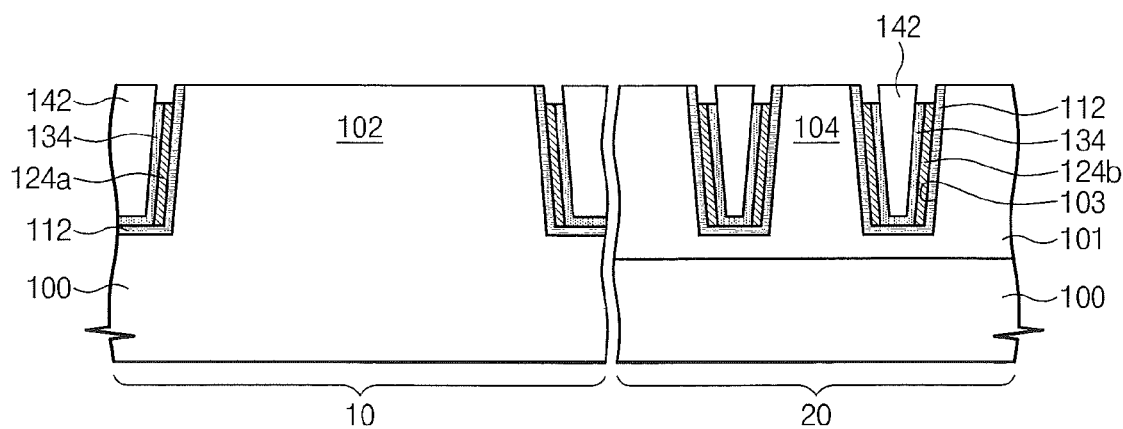

Referring to FIG. 10D, the upper surface of the barrier patterns 124a and 124b, which is exposed by the planarization process for the nitride pattern 134, may be recessed. The barrier patterns 124a and 124b may be recessed by means of a wet etching or dry etching process. The upper surface of the recessed barrier patterns 124a and 124b may be formed substantially at the same heights as the upper surface of the nitride pattern 134.

As the nitride pattern 134 and the barrier patterns 124a and 124b being recessed, portions of sidewalls of the oxide pattern 112 and the filling dielectric layer pattern 142 at the upper portion of the trench 103 may be exposed.

Figure 10E:
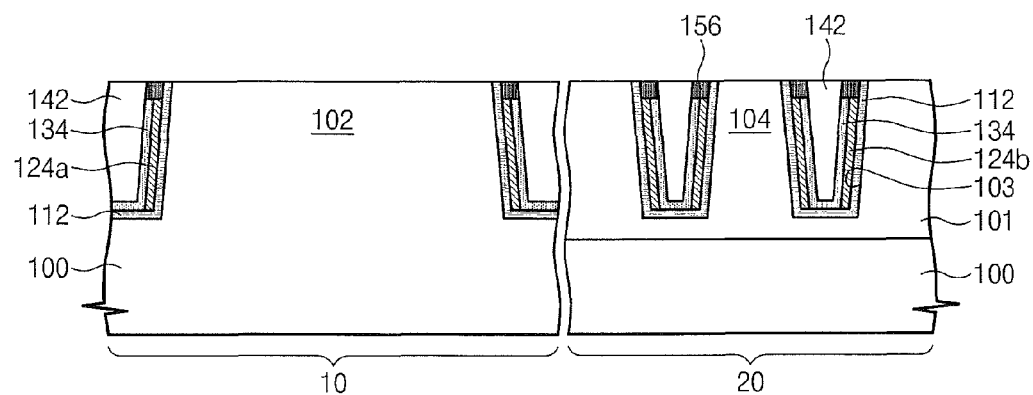

Referring to FIG. 10E, a buffer dielectric layer 156 filling portions of the trench 103, where the sidewalls of the barrier patterns 124a and 124b and the nitride pattern 134 are exposed, may be exposed. The buffer dielectric layer 156 may be formed by depositing an oxide pattern 112 using deposition methods such as CVD or ALD. Alternatively, the buffer dielectric layer 156 may be formed of a native oxide, which is formed during a subsequent process. During the deposition of the buffer dielectric layer 156, the buffer dielectric layer 156 may be deposited not only inside of the trench 103, but also on the oxide pattern 112 at the active regions 102 and 104. In such a case, a planarization process for the buffer dielectric layer 156 may also be performed.

After forming the buffer dielectric layer 156, an ion-implantation process may be performed to form the channels of transistors by regions. More specifically, p-type impurities may be implanted into the active regions 102 and 104 in the first region 10 where NMOS is to be formed, and n-type impurities may be implanted into the active regions 102 and 104 in the second region 20 where PMOS is to be formed. Because the surface of the barrier patterns 124a and 124b between the active regions 102 and 104 and the filling dielectric layer 142 is not exposed during the channel ion-implantation process, the barrier patterns 124a and 124b may remain as an undoped polysilicon.

Figure 10F:
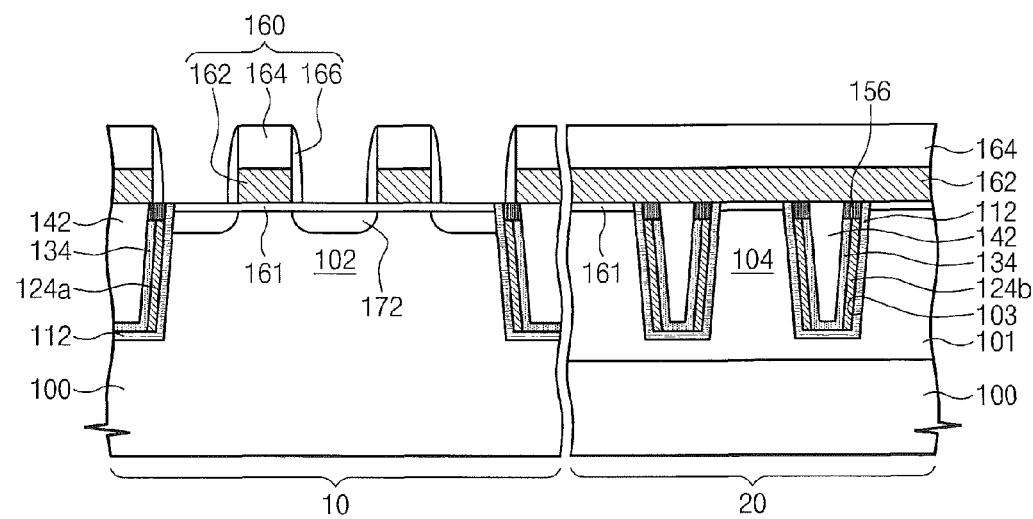

Referring to FIG. 10F, as illustrated with reference to FIG. 7G, a gate line 160 may be formed crossing the active regions 102 and 104. The gate line 160 may be formed on a gate dielectric layer 161 and on the nitride pattern 132 and the filling dielectric layer 142 around the active regions 102 and 104. Even in the case that the barrier patterns 124a and 124b are formed of a conductive material, the barrier patterns 124a and 124b may not come into contact with the gate conductive pattern 162 because the upper surface of the barrier patterns 124a and 124b is lower than that of the semiconductor substrate 100.

Thereafter, referring to FIG. 6, a contact plug 182 may be formed to come into contact with the impurity regions 172. The process for forming the contact plug 182 may comprise forming an interlayer dielectric layer (not shown) covering the gate line 160, forming a contact hole exposing the impurity regions 172 by anisotropically etching the interlayer dielectric layer, filling the contact hole with a conductive material, and planarizing the same. When forming the contact hole, a portion of the gate dielectric layer 161 on the impurity region 172 may be etched to form a gate dielectric pattern 163.

The distance between the upper surface of the barrier patterns 124a and 124b and the nitride pattern 134 and the upper surface of the semiconductor substrate 100 may be larger than the thickness of the gate dielectric layer 161. Therefore, when forming the contact hole, the barrier patterns 124a and 124b may be prevented from being exposed even though the nitride pattern 134 around the active regions 102 and 104 are etched.

According to a semiconductor device of one example embodiment of the present inventive concepts, the barrier pattern can prevent holes from being induced in the active region by hot electrons trapped to the nitride pattern. In other words, during the operation of a PMOS transistor, hole may not be induced at the boundary between the channel region and the device isolation layer by the hot electrons trapped to the nitride pattern, therefore, leakage current of the PMOS transistor may be reduced. Accordingly, the degradation of the characteristics of the transistor can be prevented.

Although some embodiments of the present inventive concepts are illustrated referring to the attached drawings, it is readily apparent to those skilled in the art that the present inventive concepts can have various different combinations and/or modifications without modifying its technical concepts or essential features. Therefore, the foregoing disclosure is illustrative and not intended to limit the present inventive concepts in any way.

What is claimed is:

1. A semiconductor device having a device isolation structure, comprising:
   a trench formed in a semiconductor substrate to define an active region, the semiconductor substrate including an NMOS region and a PMOS region;
   a filling dielectric layer provided within the trench;
   an oxide layer provided between the filling dielectric layer and the trench;
   a nitride layer provided between the oxide layer and the filling dielectric layer;
   an inner wall of the trench in the NMOS region is covered with the oxide layer and the nitride layer;
   an inner wall of the trench in the PMOS region is covered with the oxide layer, the nitride layer, and a barrier layer provided between the oxide layer and the nitride layer; and
   the nitride layer is in direct contact with the oxide layer in the NMOS region.

2. The semiconductor device claim 1, wherein the barrier layer comprises one of undoped polysilicon, doped polysilicon, and metal.

3. The semiconductor device of claim 1, wherein a thickness of the barrier layer is less than a thickness of the nitride layer.

4. The semiconductor device of claim 1, wherein the barrier layer is conformally provided on a sidewall portion and a bottom portion of the trench.

5. The semiconductor device of claim 1, wherein the barrier layer is provided on a sidewall portion of the trench and the nitride layer is in direct contact with the oxide layer at a bottom portion of the trench.

6. The semiconductor device of claim 1, wherein the nitride layer is in contact with the oxide layer at an upper portion of the trench.

7. The semiconductor device of claim 1, further comprising:
 a buffer insulating layer covering an upper surface of the barrier layer at an upper portion of the trench.

8. The semiconductor device of claim 7, wherein the buffer insulating layer is provided between the oxide layer and the nitride layer.

9. The semiconductor device of claim 1, wherein the buffer insulating layer is provided between the oxide layer and the filling insulating layer.

10. The semiconductor device of claim 1, wherein a distance between an uppermost surface of the barrier layer and an upper surface of the semiconductor substrate is greater than a thickness of the oxide layer.

11. The semiconductor device of claim 1, wherein a distance between an uppermost surface of the nitride layer and an upper surface of the semiconductor substrate is greater than a thickness of the oxide layer.

12. The semiconductor device of claim 1, further comprising:
 a gate line crossing the active region on the semiconductor substrate;
 impurity regions at both sides of the gate line; and
 the barrier layer comprising a doped polysilicon layer having an opposite conductivity type to the impurity regions.

* * * * *